United States Patent [19]

Zanio et al.

[11] 4,113,531

[45] Sep. 12, 1978

[54] PROCESS FOR FABRICATING POLYCRYSTALLINE INP-CDS SOLAR CELLS

[75] Inventors: Kenneth W. Zanio, Agoura; Lewis M. Fraas, Malibu, both of Calif.

[73] Assignee: Hughes Aircraft Company, Culver City, Calif.

[21] Appl. No.: 735,560

[22] Filed: Oct. 26, 1976

[51] Int. Cl.$^2$ .................. H01L 21/36; H01L 21/477; H01L 27/14

[52] U.S. Cl. ..................................... 148/174; 29/572; 136/89 TF; 136/89 CD; 357/30; 357/59

[58] Field of Search .............. 136/89 TF; 357/30, 59; 148/174; 29/572

[56] References Cited

U.S. PATENT DOCUMENTS 3,699,401 10/1972 Tietjen ................................... 357/30

OTHER PUBLICATIONS

Hovel H. J., "Semiconductors and Semimetals, Volume II, Solar Cells", Academic Press, N. Y., 1975, pp. 217-222.
Bachmann et al., "Preparation of P-Type InP — Vapor Deposition."J. Electrochem. Soc., vol. 123, No. 10, Oct. 1976, pp. 1509-1513.
Fraas et al., "InP Epitaxial Thin-Film — Reactive Deposition", Applied Physics Letters, vol. 28, No. 8, Apr. 15 1976, pp. 415-417.
H. Hovel, "Semiconductors & Semimetals, Volume II, Solar Cells," Academic Press, N. Y., 1975, pp. 103-111.
K. J. Bachmann et al., "Polycrystalline Thin-Film InP-CdS Solar Cells", Appl. Phys. Letters, vol. 29, No. 2, July 1976, pp. 121-123.

Primary Examiner—L. Dewayne Rutledge
Assistant Examiner—W. G. Saba
Attorney, Agent, or Firm—William J. Bethurum; W. H. MacAllister

[57] ABSTRACT

The specification describes a compound semiconductor solar cell and fabrication process therefor wherein both the F and N-type layers of the cell are polycrystalline semiconducting material and have large crystallites with grain boundaries of similar dimensions and spacings. These grain boundaries are spaced apart by a distance substantially greater than the optical absorption length, Λ, in one of the layers and by an amount sufficient to permit substantial numbers of photon-generated carriers in that one layer to cross the PN junction between the layers. Thus, substantial power is generated without the requirement for using expensive monocrystalline semiconductive materials.

4 Claims, 6 Drawing Figures

PROCESS FOR FABRICATING POLYCRYSTALLINE INP-CDS SOLAR CELLS

FIELD OF THE INVENTION

This invention relates generally to improved semiconductor solar cells and their fabrication and more particularly to an all-polycrystalline compound semiconductor solar cell which may be fabricated at a relatively low cost.

BACKGROUND

Solar cells fabricated with various III-V compound semiconductors, such as galium arsenide (GaAs) and indium phosphide (InP), are generally well known in the solar cell art and have been fabricated with layers of both monocrystalline P-type and monocrystalline N-type materials to define the PN junction of the cell. Alternatively, these cells have been constructed using a combination of polycrystalline and monocrystalline semiconductor layers to form a PN heterojunction therebetween.

Examples of an all monocrystalline type of compound semiconductor solar cell are disclosed in Applied Physics Letters, Vol. 26, p. 457–467 (1975). An example of a combination monocrystalline-polycrystalline solar cell with a PN heterojunction is disclosed, for example, by S. Wagner et al in *Applied Physics Letters* No. 26, page 229 (1975).

While the above generally described cells represent some improvements relative to certain prior art solar cell fabrication techniques, their requirement for at least one monocrystalline semiconductor layer clearly limits the fabrication cost reduction of the cells as a result of the well-known refined process requirements for growing monocrystalline semiconductor materials. Therefore, because of the widespread interest in reducing the cost of solar cell fabrication while maintaining an acceptable conversion efficiency for same, the desirability to provide a commercially feasible all polycrystalline solar cell is manifest.

THE INVENTION

The general purpose of this invention is to provide an all-polycrystalline solar cell which exhibits an acceptable conversion efficiency and overall operational performance while at the same time being adaptable to relatively low cost fabrication at high yields. To accomplish this purpose, we have discovered and therefore developed a polycrystalline solar cell structure including a PN junction therein for generating power and defined by a first layer of one polycrystalline semiconductive material of a first conductivity type adjacent a second layer of another polycrystalline semiconductive material of a second conductivity type. The second layer has a thickness which is greater than the optical absorption length, $\Lambda$, therein by a predetermined amount, and the first and second layers have grain boundaries of approximately the same dimensions and locations. These dimensions are greater than $\Lambda$ by an amount sufficient to permit substantial numbers of photon-generated carriers in the second layer to cross the PN junction of the device without reaching the grain boundaries therein. Therefore, this structure enables relatively low cost polycrystalline deposition techniques to be used in the fabrication of both the first and second semiconducting layers of the device and thus minimizes overall fabrication cost for our solar cell.

Accordingly, it is an object of the present invention to provide a new and improved solar cell which may be constructed of different polycrystalline semiconductive materials.

Another object is to provide an all polycrystalline solar cell of the type described which may be fabricated using existing polycrystalline deposition techniques for forming P and N-type semiconductor layers of the cell.

Another object is to provide a polycrystalline solar cell of the type described which may be fabricated at relatively low costs when compared to prior art solar cells requiring one or more monocrystalline semiconductor layers.

A feature of this invention is the provision of a solar cell having polycrystalline P and N-type layers with grain boundaries of similar dimensions and spacings, and which dimensions exceed the optical absorption length, $\Lambda$, in one of the layers by an amount sufficient to enable substantial numbers of photon-generated carriers in one of the layers to cross the PN junction of the structure without reaching the grain boundaries therein.

These and other objects and features of the invention will become more readily apparent in the following description of the accompanying drawing.

DETAILED DESCRIPTION OF THE INVENTION

Figure 1A:
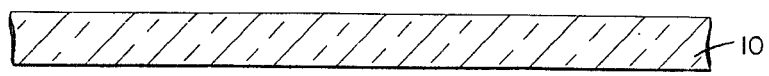
FIGS. 1a–1e represent schematically one sequence of processing steps which may be utilized in constructing a polycrystalline solar cell according to our invention.

Referring now to FIG. 1a, there is shown a substrate 10 of amorphous transparent glass, which is the starting material for our process. The glass substrate 10 may be a commercially available glass capable of withstanding temperatures of at least 500° C and preferably a type of glass upon which a thin coating 12 of indium-tin-oxide (ITO) may be evaporated or sputtered. The ITO layer 12 may be deposited as shown in FIG. 1b with good adherance and bonding using standard state-of-the-art ITO deposition techniques such as those described by Thornton et al, *Journal of Vacuum Science Technology*, Vol. 13, No. 1 Jan./Feb. 1976 at pages 117–121.

Figure 1B:
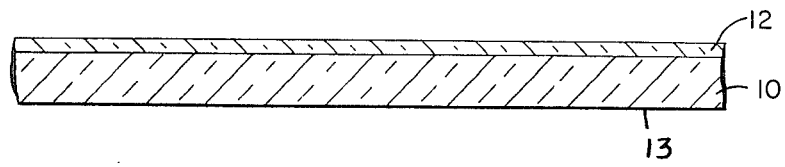
Figure 1C:
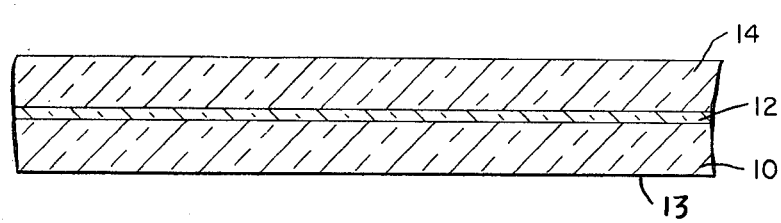

The indium-tin-oxide layer 12 in FIG. 1b is deposited on the amorphous transparent glass substrate 10 in order to provide an anti-reflective coating for the solar radiation received at the opposite substrate surface 13. This ITO layer 12 also provides a good strong mechanical bond between the glass substrate 10 and a subsequently deposited polycrystalline layer 14 of cadmium sulfide (CdS) as indicated in FIG. 1c. Briefly, the CdS polycrystalline film 14 is evaporated in a recrystallization process wherein the CdS is subsequently heat treated in a gaseous mixture of $H_2$ and $H_2S$ at approximately 500° C for about 30 minutes. This heat treatment induces a change in the crystal structure of the CdS film 14 and in fact increases the size (lateral dimension) of the crystallites in the CdS film from approximately 1 micrometer to approximately 20 micrometers, for a 12 micrometer thick CdS film. The indium-tin-oxide (ITO) layer 12 between the N-type cadmium sulfide layer 14 and the glass substrate 10 also serves as a conducting contact for the cadmium sulfide layer 14. The CdS layer 14 provides a good lattice match to a subsequently deposited indium phosphide (InP) layer 16 to thereby reduce surface states and excessive minority carrier recombination in the P-type InP layer 16. This InP layer 16 is subsequently evaporated in polycrystalline form as shown in FIG. 1d on the upper surface of the cadmium sulfide layer 14, and in a manner to be further described.

Prior to the InP layer 16 deposition and after the cadmium sulfide layer 14 has been evaporated on the indium-tin-oxide layer 12, as shown in FIG. 1c, the CdS layer 14 is recrystallized to form a quasi-single-crystal N-type material characterized by large crystallites with grain boundaries spaced on the order of 20 micrometers or greater. This dimension is identified as T3 in FIG. 2 and is discussed further below with reference to FIG. 2. Thus, the terms "polycrystalline" and "quasi-single-crystal" are used synonymously herein, and the term "quasi-single-crystal" simply refers to a polycrystalline semiconductor material having large crystallites defined by very large grain boundaries. These grain boundaries are spaced by a dimension (T3) which is typically on the order of about 20 micrometers or greater, but which necessarily must be much greater than $\Lambda$, ie., T3$>>$ $\Lambda$. One useful process for forming such a quasi-single-crystal layer 14 of N-type cadmium sulfide is disclosed, for example, in a copending application by Lewis M. Frass et al, Ser. No. 563,890, filed Mar. 31, 1975 and assigned to the present assignee. Such application is, of course, fully incorporated herein by reference.

Figure 1D:
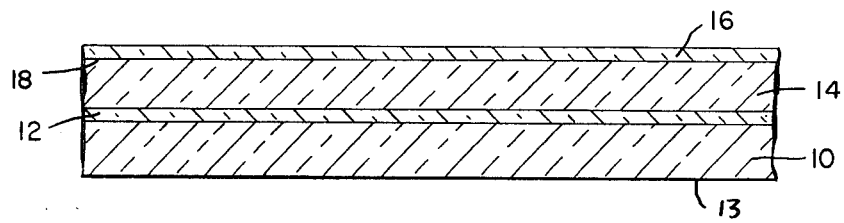

After the recrystallization of the N-type cadmium sulfide layer 14 in FIG. 1c has been completed by suitable annealing, the structure of FIG. 1c is transferred to an indium phosphide deposition station where a thin layer 16 of P-type indium phosphide is deposited as shown in FIG. 1d to form a PN junction 18 located between the P and N-type layers 14 and 16. The P-type indium phosphide layer 16 is also quasi-single-crystal in form and has a crystallographic structure with large crystallite grain boundaries having lateral dimensions which closely match those of the previously formed cadmium sulfide layer 14. The thickness of the P-type InP layer 16 is typically on the order of about 1 micrometer, but may be deposited, economically as thick as 4 micrometers. The layer 16 is deposited at approximately 375 degrees centigrade and under a pressure of $10^{-4}$ Torr using, for example, the phosphine gas ($PH_3$) deposition technique disclosed in a copending application Ser. No. 631,981, filed Nov. 14, 1975 and assigned to the present assignee. Briefly, the planar reactive deposition (PRD) process of Serial No. 631,981 involves evaporating indium metal from a planar source including a cavity integral therewith into which phosphine gas, $PH_3$, is introduced and decomposed. The decomposition reaction products, $P_2$ and $H_2$, are emitted from within the source cavity and through a perforated top plate thereof, and the combined In - P - H vapor stream from the source forms the InP film 16 upon arrival at the CdS layer 14. Using this PRD process of Ser. No. 631,981, the lateral grain boundaries of the first or CdS layer 14 can be replicated in the much thinner InP layer 16. This replication results from the tendency of epitaxial growth to occur at the exposed upper surfaces of the large CdS crystallites in the previously deposited CdS layer 14.

Figure 1E:
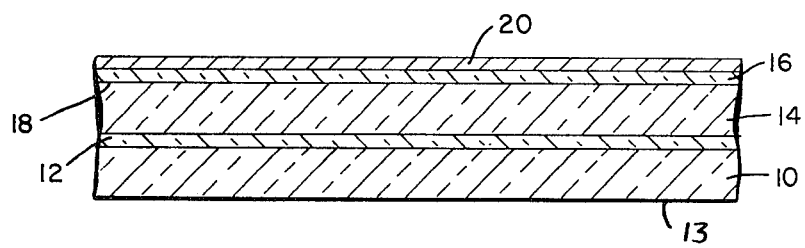

After the indium phosphide layer 16 has been deposited using for example the procedures set forth in the above copending application Ser. No. 631,981, an upper ohmic contact member 20 is evaporated thereon using suitable metal evaporation techniques. Advantageously, either a zinc-gold layer or a copper layer may be utilized to form a good upper ohmic contact 20 for the P-type layer 16. This ohmic contact 20 may only cover a selected portion of the upper surface of the P-type layer 16, as indicated in FIG. 2; and FIG. 1e is the cross-section view shown in the right hand end of the perspective view of FIG. 2.

Figure 2:
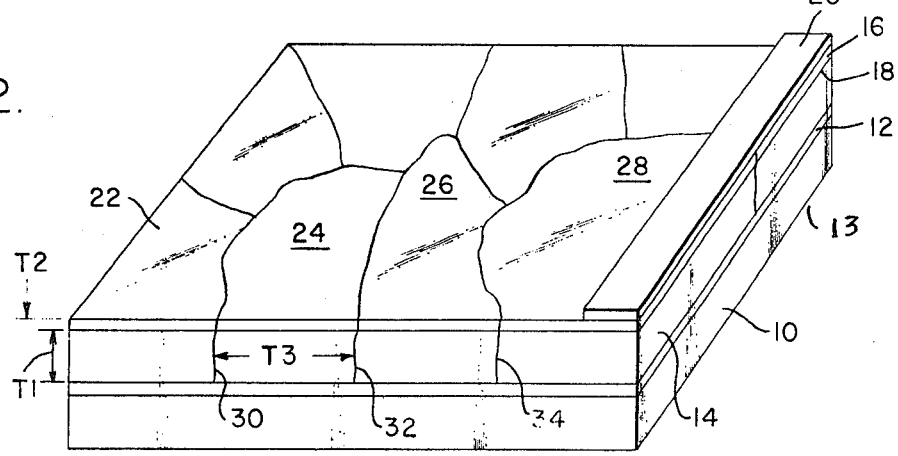
FIG. 2 is a perspective view of our completed solar cell and illustrating the large crystallites and grain boundaries therein. The right hand end of FIG. 2 corresponds to FIG. 1e.

Referring now to FIG. 2, the quasi-single-crystal layer 14 of cadmium sulfide has a thickness T1 which is typically on the order of five to twenty times the optical absorption length $\Lambda$ in the indium phosphide layer 16. $\Lambda$ is defined as the average distance that light will travel after entering a semiconductor body before being absorbed to thereby create carriers of opposite charge. The thickness T2 of the indium phosphide layer 16 is typically one to four times $\Lambda$, and the value of $\Lambda$ in the indium phosphide layer 16 is between 0.5 and 1.0 micrometers. Therefore, the carriers generated in the indium phosphide layer 16 by incident photon radiation will have to travel, on the average, from between 0.5 and 1.0 micrometers before crossing the PN junction 18. Therefore, a very substantial number of photon-generated carriers in the P-type indium phosphide layer 16 will cross the PN junction 18 and generate power without reaching a grain boundary of one of the large crystallites which form the P and N-type layers 14 and 16. As mentioned previously, these boundaries are spaced apart by a dimension T3, which will average approximately 40 micrometers or greater. Therefore, this carrier propagation across the PN junction 18 and wholly within the multiple single crystal regions or crystallites 22, 24, 26 and 28 has the effect of generating the voltage and current at conducting contacts 12 and 20 which are responsible for producing solar cell output power.

Obviously, some of the photon-generated carriers produced in these individual large crystallites 22, 24, 26, and 28 will be propagated into the grain boundaries 30, 32, and 34, respectively, and thus be channeled therethrough without generating any power in the solar cell structure. But a very large majority of these photon induced carriers will indeed cross the PN junction 18 of the structure either before or without reaching these grain boundaries 30, 32, and 34. It is this physical phenomenon which is responsible for the production of substantial amounts of output power from the solar cell structure.

Thus, for an optical absorption length $\Lambda$ of about 0.5 micrometers in the indium phosphide layer 16, and with thickness dimensions T1 and T3 of more than twenty times $\Lambda$, or 20 micrometers, it is seen that the photon-induced carriers generated in the indium phosphide layer 16 would, on the average, have to travel no more than about 0.5 micrometers from within the layer 16 to cross the PN junction 18. But these carriers may have to travel as much as 40 times that far from the central portion of the crystallites 22, 24, 26 and 28 in order to reach the nearest grain boundary 30, 32, or 34 as shown in FIG. 2.

What is claimed is:

1. A process for fabricating a polycrystalline indium phosphide-cadmium sulphide (InP/CdS) solar cell having large crystallites and a very thin layer of indium phosphide which comprises the steps of:
(a) depositing a layer of polycrystalline cadmium sulphide on a chosen substrate, (b) heating said cadmium sulphide layer at a predetermined elevated temperature and time sufficient to induce a change in the crystal structure of said cadmium sulphide layer and substantially increase the size and lateral dimension of crystallites in said cadmium sulphide layer from approximately one micrometer to a lateral dimension of the order of 20 micrometers, and thereafter (c) depositing a layer of polycrystalline indium phosphide on said polycrystalline cadmium sulphide layer and having an optical absorption length $\Lambda$ and a thickness in the range of between 1 and 4 times $\Lambda$ and further having relatively large crystallites with replicated grain sizes and boundaries of approximately the same lateral spacing as those in said cadmium sulphide layer, whereby the lateral grain boundary spacing in both said cadmium sulphide and indium phosphide layers is between 5 and 20 times $\Lambda$, and substantial numbers of photon generated carriers in said indium phosphide layer will cross a PN junction between said indium phosphide and cadmium sulphide layers without or before reaching said grain boundaries therein, and enabling the relatively low cost polycrystalline semiconductor fabrication of InP/CdS solar cells utilizing relatively small amounts of indium.

2. The process defined in claim 1 wherein the deposition of said cadmium sulphide layer on a chosen substrate includes initially providing an amorphous transparent glass substrate, depositing a thin layer of indium tin oxide on said glass substrate for providing a good adhesive bond thereto, thereafter sequentially depositing said cadmium sulphide and indium phosphide layers on said indium tin oxide layer, and then depositing an upper ohmic contact strip on the upper surface of said indium phosphide layer, whereby said indium tin oxide layer and said upper ohmic contact strip provide series electrical connections to said cell.

3. A process for fabricating a polycrystalline indium phosphide-cadmium sulphide solar cell with large grains which comprises:

(a) evaporatively depositing a cadmium sulphide layer on a chosen substrate and at a predetermined elevated temperature and time sufficient to achieve a desired layer thickness and thereafter annealing said cadmium sulphide layer to increase the grain size therein from a lateral dimension of approximately one micrometer to a lateral dimension of the order of 20 micrometers, and (b) depositing a thin layer of polycrystalline indium phosphide on said polycrystalline cadmium sulphide layer and having an optical absorption length $\Lambda$ and a thickness between 1 and 4 times $\Lambda$, whereby said indium phosphide layer is replicated with large grains having lateral boundaries of approximately the same dimension and spacing as the grain boundaries of said cadmium sulphide layer and between 5 and 20 times $\Lambda$, while minimizing the quantity of indium phosphide in said cell.

4. The process defined in claim 3 wherein the deposition of said cadmium sulphide layer on a chosen substrate includes initially providing an amorphous transparent glass substrate, depositing a thin layer of indium tin oxide thereon for providing a good adhesive bond for said glass substrate, sequentially depositing said cadmium sulphide and indium phosphide layers on said indium tin oxide layer, and depositing an upper ohmic contact layer on said indium phosphide layer whereby said upper ohmic contact layer and said indium tin oxide layer provide series electrical connections to said solar cell.

* * * * *